(12) United States Patent
Mahajan et al.

(10) Patent No.: US 10,348,200 B2
(45) Date of Patent: Jul. 9, 2019

(54) DIGITAL CURRENT SENSOR FOR ON-DIE SWITCHING VOLTAGE REGULATOR

(71) Applicants: Tarun Mahajan, Karnataka (IN); Ramnarayanan Ram Muthukaruppan, Ka (IN); Srinivasulu Malepati, Ka (IN); George Matthew, Hillsboro, OR (US)

(72) Inventors: Tarun Mahajan, Karnataka (IN); Ramnarayanan Ram Muthukaruppan, Ka (IN); Srinivasulu Malepati, Ka (IN); George Matthew, Hillsboro, OR (US)

(73) Assignee: INTEL CORPORATION, Santa Clara, CA (US)

( * ) Notice: Subject to any disclaimer, the term of this patent is extended or adjusted under 35 U.S.C. 154(b) by 1093 days.

(21) Appl. No.: 14/294,045

(22) Filed: Jun. 2, 2014

(65) Prior Publication Data

US 2015/0346247 A1    Dec. 3, 2015

(51) Int. Cl.
*H02M 1/00* (2006.01)
*H02M 1/32* (2007.01)
*H02M 1/40* (2007.01)
*G01R 19/25* (2006.01)
*H02M 1/088* (2006.01)
*H02M 3/157* (2006.01)
*H02M 3/158* (2006.01)

(52) U.S. Cl.
CPC .......... *H02M 3/158* (2013.01); *H02M 1/088* (2013.01); *G01R 19/25* (2013.01); *H02M 1/32* (2013.01); *H02M 1/40* (2013.01); *H02M 3/157* (2013.01); *H02M 3/1584* (2013.01); *H02M 2001/0009* (2013.01); *H02M 2001/0032* (2013.01); *H02M 2001/0058* (2013.01); *Y02B 70/1491* (2013.01); *Y02B 70/16* (2013.01)

(58) Field of Classification Search
CPC ...... H02M 3/157; H02M 3/158; H02M 1/088; H02M 1/32; H02M 1/40; G01R 19/25
See application file for complete search history.

(56) References Cited

U.S. PATENT DOCUMENTS

| | | | | |
|---|---|---|---|---|
| 6,930,474 B2* | 8/2005 | Wang | .................. | H02M 3/1588 323/224 |
| 7,453,250 B2* | 11/2008 | Qiu | ..................... | H02M 3/1584 323/282 |
| 7,466,116 B2* | 12/2008 | Sato | .................... | H02M 3/1584 323/285 |
| 7,605,573 B2* | 10/2009 | Nishida | ............. | H02M 3/33523 323/282 |
| 7,652,945 B2* | 1/2010 | Chu | ..................... | H02M 3/1588 323/271 |
| 7,679,348 B2* | 3/2010 | Sohma | ................. | H02M 3/156 323/282 |

(Continued)

*Primary Examiner* — Bryan Bui
(74) *Attorney, Agent, or Firm* — Womble Bond Dickinson (US) LLP

(57) ABSTRACT

Described is an apparatus which comprises: an output node; a capacitor; an inductor having a first terminal coupled to the output node, and a second terminal coupled to the capacitor; a bridge to receive an input power supply and to generate a switching voltage signal at the output node; and a current sensor to determine slope of the switching voltage signal on the output node.

19 Claims, 7 Drawing Sheets

(56) References Cited

U.S. PATENT DOCUMENTS

| | | | | |
|---|---|---|---|---|
| 7,936,160 B1* | 5/2011 | Sheehan | H02M 3/156 | 323/222 |
| 7,940,596 B2* | 5/2011 | Chu | H02M 3/1588 | 323/271 |
| 7,960,997 B2* | 6/2011 | Williams | H01L 23/49575 | 324/762.09 |
| 7,990,118 B2* | 8/2011 | Feng | H02M 3/1588 | 323/271 |
| 8,085,026 B2* | 12/2011 | Iliasevitch | H02M 3/1588 | 323/224 |
| 8,154,267 B2* | 4/2012 | Noda | H02M 3/156 | 323/284 |
| 8,344,711 B2* | 1/2013 | Futamura | H02M 3/156 | 323/224 |
| 8,513,933 B2* | 8/2013 | Notman | H02M 3/1588 | 323/284 |
| 8,519,691 B2* | 8/2013 | McCloy-Stevens | H02M 3/1588 | 323/284 |
| 9,035,632 B2* | 5/2015 | Futamura | H02M 3/1588 | 323/282 |
| 9,184,659 B2* | 11/2015 | Song | H02M 3/1588 | |
| 2004/0056644 A1* | 3/2004 | Wang | H02M 3/1588 | 323/288 |
| 2005/0225307 A1* | 10/2005 | Sato | H02M 3/1584 | 323/282 |
| 2007/0013356 A1* | 1/2007 | Qiu | H02M 3/1584 | 323/288 |
| 2007/0247131 A1* | 10/2007 | Sohma | H02M 3/156 | 323/284 |
| 2007/0285073 A1* | 12/2007 | Nishida | H02M 3/33523 | 323/288 |
| 2008/0203997 A1* | 8/2008 | Foran | H02M 3/1588 | 324/76.11 |
| 2008/0246455 A1* | 10/2008 | Chu | H02M 3/1588 | 323/283 |
| 2009/0045791 A1* | 2/2009 | Feng | H02M 3/1588 | 323/282 |
| 2010/0052629 A1* | 3/2010 | Chu | H02M 3/1588 | 323/239 |
| 2010/0066333 A1* | 3/2010 | Noda | H02M 3/156 | 323/282 |
| 2010/0127684 A1* | 5/2010 | Iliasevitch | H02M 3/1588 | 323/285 |
| 2010/0283440 A1* | 11/2010 | Futamura | H02M 3/158 | 323/282 |
| 2011/0018515 A1* | 1/2011 | McCloy-Stevens | H02M 3/1588 | 323/284 |
| 2011/0018516 A1* | 1/2011 | Notman | H02M 3/1588 | 323/284 |
| 2011/0025283 A1* | 2/2011 | Futamura | H02M 3/1588 | 323/282 |
| 2012/0119718 A1* | 5/2012 | Song | H02M 3/1588 | 323/282 |
| 2014/0015503 A1* | 1/2014 | Cheng | H02M 3/1588 | 323/282 |

* cited by examiner ns. The embodiments of a synthesizable digital scheme for dynamic current sensing can be used for VRs that switch operation from Pulse Width Modulation (PWM) mode (at higher loads) to Pulse Frequency Modulation (PFM) or hysteretic mode (at lighter loads). Some embodiments of the synthesizable digital scheme for dynamic current sensing can also be used for over-current protection and phase balancing in case of multi-phase VRs.
DIGITAL CURRENT SENSOR FOR ON-DIE SWITCHING VOLTAGE REGULATOR

BACKGROUND

With increasing demand for increased battery life for portable hand-held devices like smart phones and tablets, it is important to achieve high power-efficiency for inductor based switching voltage regulators (VRs) in all modes and states. Dynamic current sensing circuits are used for fine grain power management in different switching states and modes. For example, load current sensing data can be used to switch between Pulse Width Modulation (PWM) mode to Pulse Frequency Modulation (PFM) mode at lighter loads. Load current sensing data can also be used for phase-balancing or phase-shedding in multi-phase VRs. Dynamic current sensing is also used for over-current protection of the VR and the load in case of a catastrophic event. This current sensing data can also be used for telemetry.

Presently, for dynamic current sensing of integrated switching VRs, analog circuit techniques are used. These techniques include series sense-resistor scheme, replica sense-FET based current sensing scheme, and inductor DCR (i.e., DC resistance of the inductor) based load current sensing scheme. Each of the above schemes suffers from shortcomings.

For example, series sense-resistor scheme creates an extra conduction power loss in the VR and additional component cost, and replica sense-FET based current sensing scheme is inaccurate, suffers from a challenging integration scheme, and needs high-voltage operational amplifier to match transistor $V_{DS}$ and high resolution Analog-to-Digital Converter (ADC). Inductor DCR based load current sensing requires an on-die Gm-C filter to filter voltage across the load inductor along with tuning and calibration circuits since the value of inductance and its DCR are un-known generating area/power concerns.

As mentioned above, these current sensing solutions are analog in nature and come with an added cost in terms of area, design complexity, and/or power efficiency. These analog schemes also need significant re-design effort when ported over from one process node to another i.e., the analog scheme for current sensing do not scale well with process nodes.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
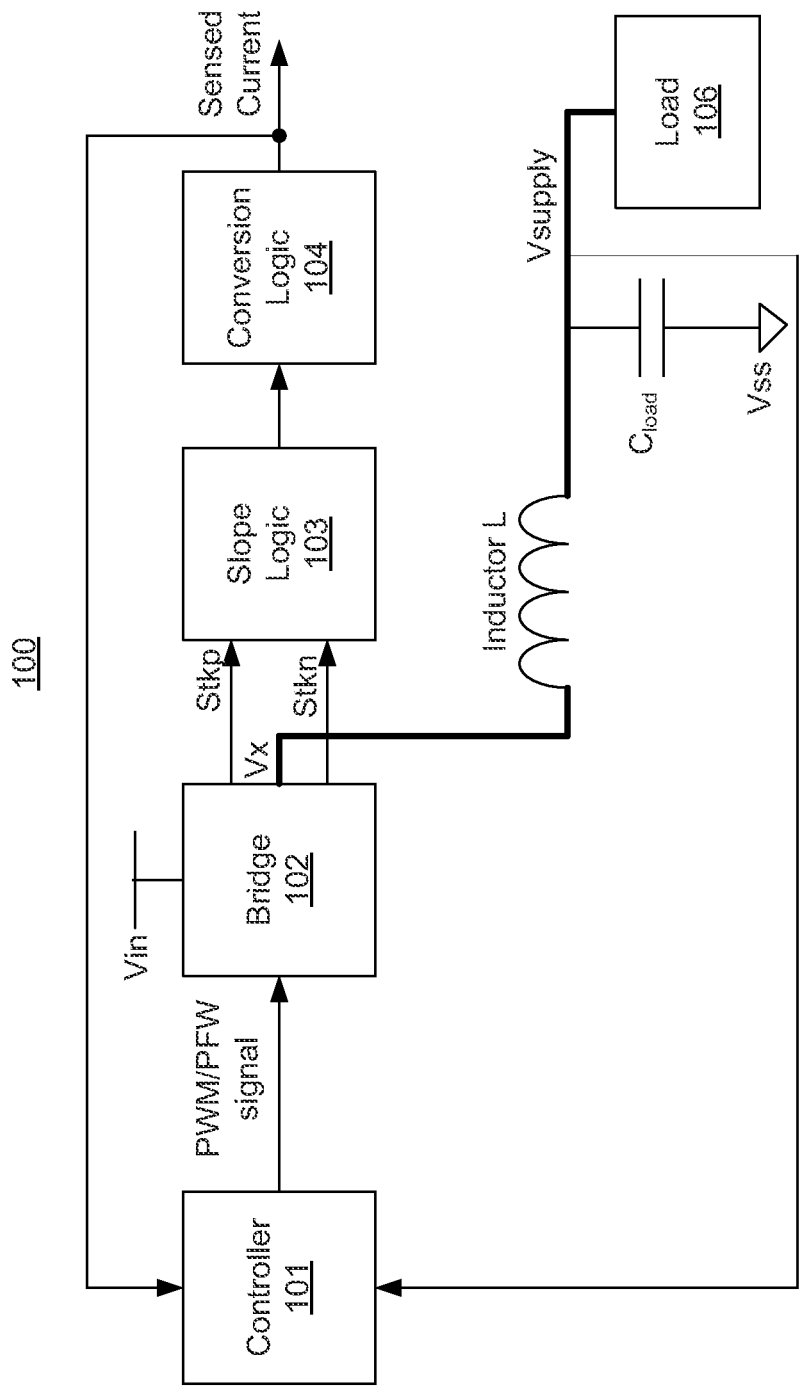
FIG. 1 illustrates a high-level apparatus with voltage regulator and digital current sensor, according to one embodiment of the disclosure.

Some embodiments describe a synthesizable digital scheme for dynamic current sensing of voltage regulators (VRs). In some embodiments, low-frequency inductor-based switching voltage regulator is described. However, the embodiments of a synthesizable digital scheme for dynamic current sensing can be used for other VR designs too. For example, some embodiments of a synthesizable digital scheme for dynamic current sensing can be used for VRs that switch operation from Pulse Width Modulation (PWM) mode (at higher loads) to Pulse Frequency Modulation (PFM) or hysteretic mode (at lighter loads). Some embodiments of the synthesizable digital scheme for dynamic current sensing can also be used for over-current protection and phase balancing in case of multi-phase VRs.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nano tubes or spintronic devices. Source and drain terminals may be identical terminals and are interchangeably used here. A transistor can also be a Tunneling FET (TFET) device which has asymmetric Source and Drain terminals. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a high-level apparatus 100 with voltage regulator (VR) and digital current sensor, according to one embodiment of the disclosure. In one embodiment, apparatus 100 comprises Controller 101, Bridge 102, Slope Logic 103, and Conversion Logic 104, Inductor L, and load capacitor $C_{load}$. In one embodiment, output of Bridge 102 is coupled via the Inductor L and load capacitor $C_{load}$ to Load 106. Controller 101, Bridge 102, Inductor L, and load capacitor $C_{load}$ together form the VR.

In one embodiment, Bridge 102 is a switching bridge that receives input power supply Vin and generates a regulated output power supply Vsupply by charging the Inductor L by turning ON a high-side switch of Bridge 102 and storing the energy. This stored energy provides the current flow through Load 106 and discharges its stored energy when high-side switch is turned OFF. During this time, the low-side switch is turned ON to prevent the body-diode from conducting. This turning ON/OFF of the switches happen according to the frequency and duty cycle of PWM/PFM signal generated by Controller 101. In one embodiment, Controller 101 includes logic and circuits to receive output Vsupply and adjusts the duty cycle and/or frequency of the PWM/PFW signal to regulate the voltage on node Vsupply. Here, the labels for a node and signal on that node are interchangeably used. For example, the term Vx is used to indicate node Vx or signal Vx depending on the context of the sentence. In one embodiment, Controller 101 also receives Sensed Current from Conversion Logic 104 (which is part of the digital current sensor). In one embodiment, Controller 101 adjusts characteristics (e.g., switching frequency) of Bridge 102 according to the Sensed Current.

In one embodiment, the digital current sensor includes Slope Logic 103 and Conversion Logic 104. In one embodiment, Slope Logic 103 generates a pulse signal for Conversion Logic 104 such that the width of the pulse is proportional to the slope of the switching (or transitioning) signal Vx. In one embodiment, Slope Logic 103 monitors voltages at two nodes—Stkp and Stkn—to infer the slope of the switching (or transitioning) signal Vx. Here, Stkp is a node of a high-side switch of Bridge 102 while Stkn is a node of a low-side switch of Bridge 102. In one embodiment, Conversion Logic 104 converts the pulse received from Slope Logic 103 to generate a code indicating Sensed Current.

Here, current sensing utilizes the fact that the slew rate of Bridge 102 switching node Vx is proportional to the load current at the output of the switching VR during its high-to-low transition (i.e., when both high-side and low-side FETs of Bridge 102 are OFF and dead-time is enough to ensure that the low-side FET switch undergoes zero-voltage soft-switching). Also the parasitic capacitance at the switching node Vx does not vary across the load current range. So, $$\text{Slew-Rate} = I_{load}/C_{bridge} \quad (1)$$

where $I_{load}$ is the output load current flowing through the inductor L and $C_{bridge}$ is the total capacitance seen at the switching node output Vx.

In one embodiment, the digital current sensor of the embodiments can be implemented in purely synthesizable digital logic making process migration (i.e., scaling) easier and reducing design-time and complexity compared to existing analog techniques.

The digital current sensing scheme discussed with reference to some embodiments is useful for many applications. For example, digital current sensing scheme is useful for applications in which switching modes of Bridge 102 are changed according to Sensed Current. Digital current sensing scheme is also useful for phase balancing and phase shedding applications, and for over-current protection applications.

In the case of multi-mode VRs, for high power efficiency, it may be beneficial to switch modes based on load current. In the mode switching application, Controller 101 switches the switching mode from PWM mode (used for high loads) to PFM mode (used for lighter loads). Usually PWM mode is used for high current mode, and PFM/hysteretic mode is used for low current mode. The traditional custom analog techniques come at an added design time cost and more power. Switching from PWM mode to PFM mode generally does not need too high of an accuracy. For example, +/−10% accuracy may suffice. The digital current sensing scheme of some embodiments switches the switching mode from PWM (used for high loads) to PFM mode (used for lighter loads) with much little power, area penalty, and design complexity compared to traditional analog techniques.

In the case of multi-phase VRs, current sensing can also be used to balance the phases. For VRs with discrete Inductor L and operating at low-frequency (e.g., 10 MHz), +/−10% accuracy in current sensing may be enough to prevent inductor L from saturating. The digital current sensing scheme of some embodiments compares the slew rate for each phase and provides that information to Controller 101 which adjusts the duty-cycle of PWM signal accordingly till the phases match. In one embodiment, the same digital current sensing circuit can be used for multiple phases or Bridges in an alternating fashion. Conversely, traditional analog techniques utilize more area and additional circuits like ADCs for phase balancing.

The over-current protection circuits for VRs usually require fast response times to protect circuits from breaking down. Typically, slew rate increases at high load currents. Accordingly, some embodiments use the same digital current sensing scheme used for other applications to indicate an over-current condition and shut-off the VR (i.e., Controller 101 and Bridge 102). Otherwise, a separate fast-response analog circuit is needed just for over-current protection or to make sure that the actual current sensing is fast enough by burning more power.

Figure 2:
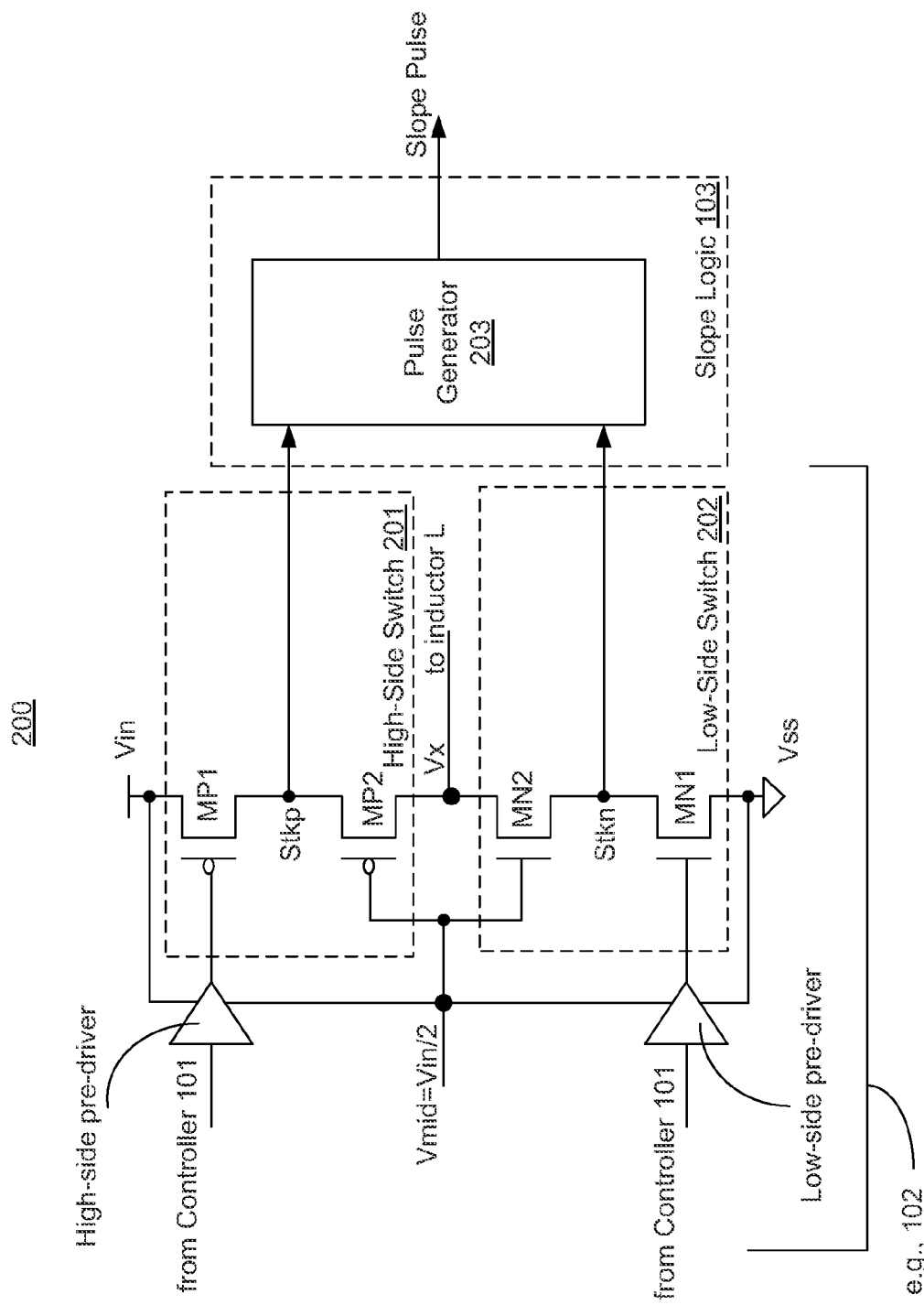
FIG. 2 illustrates a circuit of a bridge interfacing with part of the digital current sensor, according to one embodiment of the disclosure.

FIG. 2 illustrates a circuit 200 of a bridge interfacing with part of the digital current sensor, according to one embodiment of the disclosure. It is pointed out that those elements of FIG. 2 having the same reference numbers (or names) as the elements of any other figure can operate or function in any manner similar to that described, but are not limited to such.

In this embodiment, Bridge 102 is illustrated with a cascode type High-Side Switch 201 and cascode type Low-Side Switch 202. In one embodiment, High-Side Switch 201 comprises p-type MP1 coupled in series with p-type MP2, wherein source terminal of MP1 is coupled to Vin (i.e., input power supply) and where drain terminal of MP2 is coupled to the output node Vx. In this embodiment, Stkp is the common node coupling MP1 to MP2. In one embodiment, this common node (also referred here as the first common node) is used as a first point in determining slope of the signal on Vx.

In one embodiment, Low-Side Switch 202 comprises an n-type MN1 coupled in series with an n-type MN2, wherein source terminal of MN1 is coupled to Vss (i.e., ground power supply) and where drain terminal of MN2 is coupled to the output node Vx. In this embodiment, Stkn is the common node coupling MN1 to MN2. In one embodiment, this common node (also referred here as the second common node) is used as a second point in determining slope of the signal on Vx.

In one embodiment, gate terminals of MP2 and MN2 are coupled together and are biased by Vmid which is Vin/2. In one embodiment, MP1 is driven by the High-side pre-driver that provides an output that swings between Vin and Vmid. In one embodiment, MN1 is driven by the Low-side pre-driver that provides an output that swings between Vmid and ground. The inputs to the High-side and Low-side pre-drivers are provided by Controller 101.

In one embodiment, Slope Logic 103 comprises Pulse Generator 203 which generates Slope Pulse signal, representing the slope of the signal on node Vx, between the first point provided by Stkp and the second point provided by Stkn. While the embodiment is described with a stacked cascode bridge configuration, any switching VR can be configured to couple to Slope Logic 103 to generate slope of the signal on node Vx to determine load current.

Figure 3:
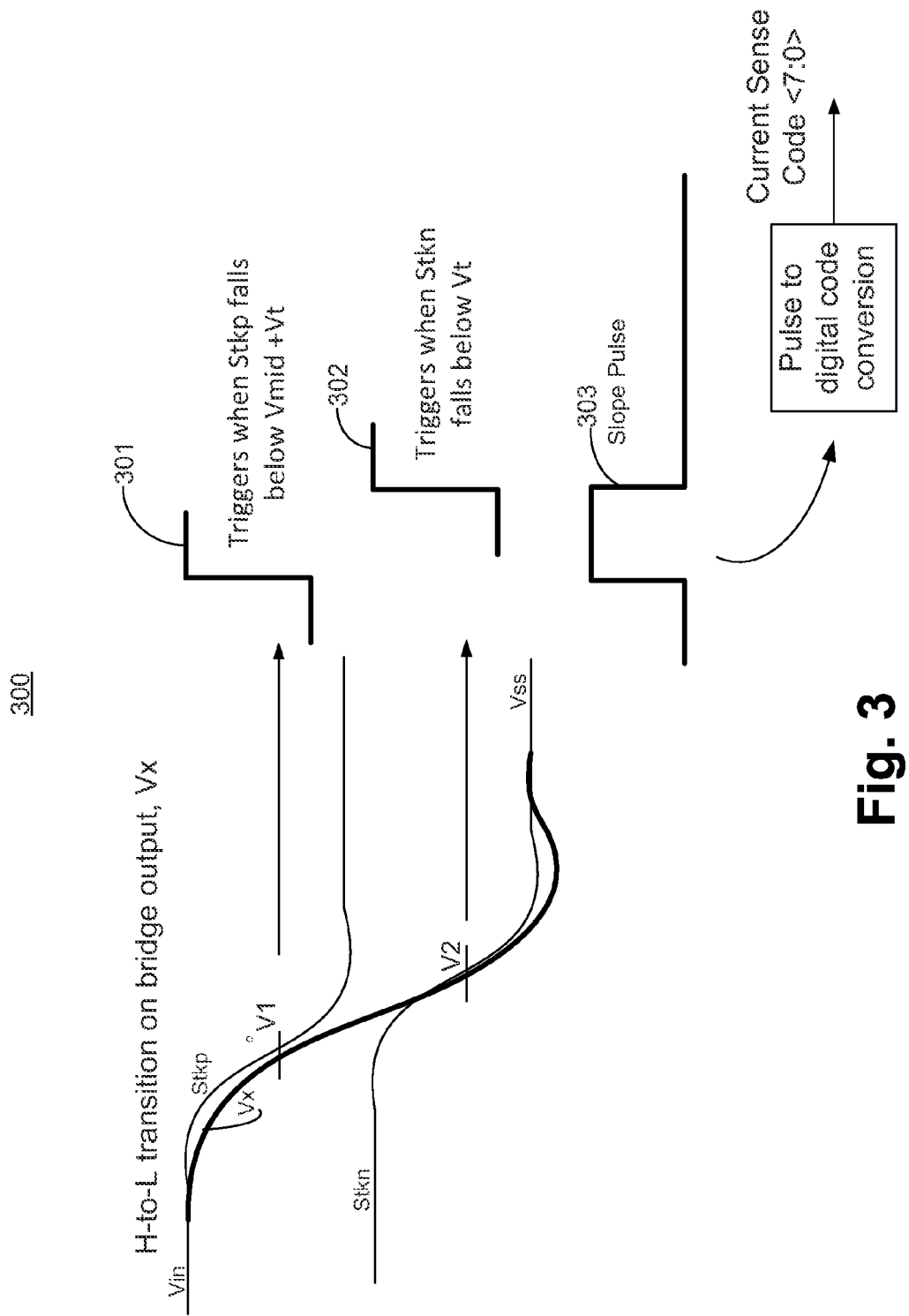
FIG. 3 illustrates voltage waveforms at various nodes of the bridge, and generation of a pulse signal representing slope of the voltage signal on the output node of the bridge, according to one embodiment of the disclosure.

FIG. 3 illustrates voltage waveforms 300 at various nodes of Bridge 102, and generation of a pulse signal representing the slope of the voltage signal on the output node of the bridge, according to one embodiment of the disclosure. It is pointed out that those elements of FIG. 3 having the same reference numbers (or names) as the elements of any other figure can operate or function in any manner similar to that described, but are not limited to such. FIG. 3 is described with reference to FIG. 4.

High-to-low (H-to-L) transition on switching node Vx occurs when the High-side Switch 201 is turned OFF and inductor current is positive (i.e., flowing from Bridge 102 to Load 106). Once the High-side Switch 201 is turned OFF, Controller 101 allows voltage on node Vx to fall freely towards ground (as shown by bold line of the waveform) until the voltage on node Vx reaches ground (VSS) as the Low-Side Switch 202 is OFF and Bridge 102 is under-going zero-voltage soft-switching. In this case, during this time, the inductor current is sourced from the parasitic capacitance of the switching node Vx. In one embodiment, as soon as voltage on node Vx reaches ground, Low-Side Switch 202 of Bridge 102 is turned ON by Controller 101 to avoid body-diode conduction.

The slew-rate of Vx output signal during its fall, as shown in FIG. 3, is purely dependent on the load current and the parasitic capacitance on the switching node Vx, ignoring the edges. Since the parasitic capacitance is independent of load current, slew-rate is proportional to load current as per equation 1. Some embodiments use this principle to determine the load current.

In one embodiment, an edge detector is used to generate a first edge 301 when voltage on Stkp node falls below Vmid plus Vt, where Vt is the threshold voltage of the input transistor of the edge detector. This triggering point is shown as voltage V1 on the Vx curve. In one embodiment, another edge detector is used to generate a second edge 302 when voltage on Stkn node falls below Vt, where Vt is the threshold voltage of the input transistor of the other edge detector. This triggering point is shown as voltage V2 on the Vx curve. In one embodiment, the two edges 301 and 302 are then used to generate the rising and falling edges respectively of Slope Pulse 303 (i.e., output of Slope Logic 103. In one embodiment, Conversion Logic 104 receives Slope Pulse 303 and converts that pulse to a digital code (e.g., a Current Sense Code <7:0> which in this example is 8 bits wide).

In one embodiment, the bridge switching node Vx is isolated from Vin at the time current sense measurement is taking place as both High-Side and Low-Side Switches 201 and 202 respectively are OFF and voltage on bridge node Vx falls freely. In such an embodiment, any supply ringing noise on Vin does not impact the current sensing measurements. In the case where any switching noise impact is present, that noise is there during all switching cycles and therefore cancels out.

In one embodiment, the DC variation in Vin supply is compensated during calibration step to determine bridge capacitance as it takes into account any skew-related supply variation. The DC variation in Vin supply due to ageing and other effects may reflect as an error in the current sensing measurement. Assuming, for example, worst case 2% DC variation and 3.5% temperature variation as measured, the overall current sense accuracy with the digital current sensing scheme is estimated to be sqrt(3.5^2+2^2) i.e., approx. 4% including all variations. In one embodiment, the accuracy can be further improved based by adding Vin sensing circuit or using fixed references for measuring slew-rate along with Digital Current Sensor 603. For example, applications with wide input Vin range can improve their accuracy using Vin sensing circuit.

Figure 4:
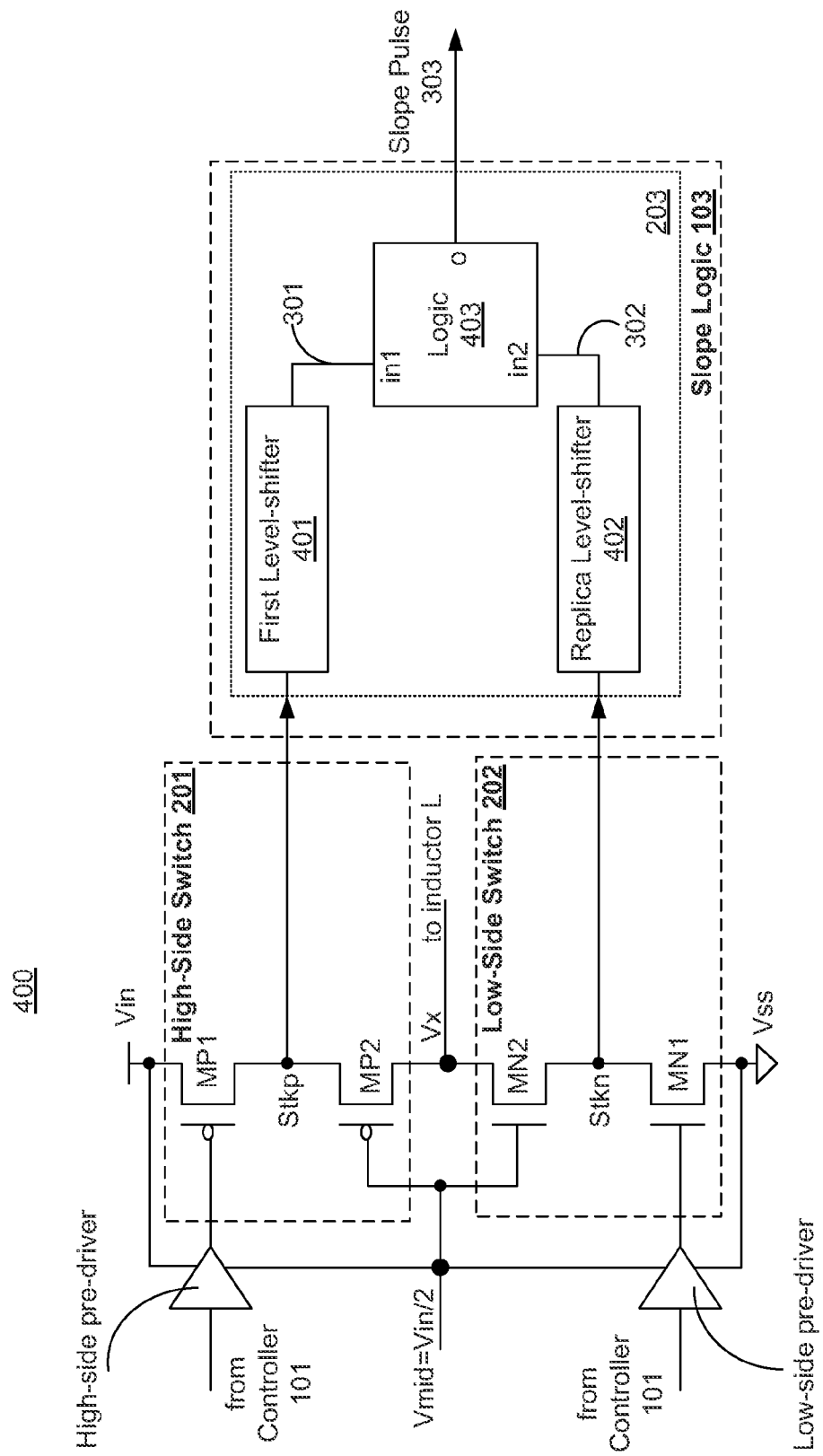
FIG. 4 illustrates an apparatus of the bridge and architecture of the slope logic of the digital current sensor, according to one embodiment of the disclosure.

FIG. 4 illustrates an apparatus 400 of Slope Logic 103 of the digital current sensor, according to one embodiment of the disclosure. It is pointed out that those elements of FIG. 4 having the same reference numbers (or names) as the elements of any other figure can operate or function in any manner similar to that described, but are not limited to such.

Apparatus 400 comprises First Level-shifter 401 (e.g., of a first edge detector), Replica Level-shifter (LS) 402 (e.g., of a second edge detector), and a compare logic 403. In one embodiment, compare logic 403 is implemented as an Exclusive-OR (XOR) gate. In other embodiments, other types of compare logic may be used. For example, a set-reset latch may be used instead of an XOR gate. So as not to obscure the embodiments, compare unit 403 is described with reference to an XOR gate. In one embodiment, XOR gate 403 is coupled together as shown. The voltage on Stkp node swings between Vin to approximately Vmid while the voltage on Stkn node swings between Vmid and Vss. In one embodiment, First Level-shifter 401 is an AC-coupled Level-shifter (LS) to shift the voltage signal on Stkp to swing between Vmid to ground.

In one embodiment, the comparison point for the voltage on Stkp node going low is approximately Vmid plus Vt of the pull-down device within First LS 401 which triggers the rising edge 301. Later, voltage on Stkn node going low is sensed similarly using Replica LS 402 (or Second LS) to trigger another rising edge 302. In one embodiment, the output of XOR gate 403 is high between the rising edge events. In one embodiment, Replica LS 402 has identical (or substantially identical) propagation delay as First Level-shifter 401. In this embodiment, input Stkn of Replica LS 402 swings from Vmid to Vss and the output 302 of Replica LS 402 swings from Vmid to Vss too.

The comparison point in this case is ground plus Vt (of the pull-down device within Replica LS 402). This fixes $\Delta V$, which is approximately Vmid, for all measurements, according to one embodiment. In one embodiment, output of XOR gate 403 is a pulse signal Slope Pulse 303 having pulse width that varies with the load current of the VR. In this embodiment, the pulse width does not vary with supply or temperature variations as both LSs 401 and 402 undergo same change, and delays cancel out.

For low-frequency switching VRs, e.g., in the range of 1 MHz to 4 MHz, switching losses may not be very dominant and the size of Bridge 102 can be made large to achieve maximum power efficiency, according to one embodiment. The effective capacitance $C_{bridge}$ on the switching node Vx can be high and it governs the slew rate on the switching node Vx.

Initially during calibration, an average value of $C_{bridge}*\Delta V$ based on known values of $I_{load}$ is determined using known load and characterizing $\Delta T$ (i.e., pulse width of pulse 303), according to one embodiment. In one embodiment, this average value is stored digitally as a constant K in memory (e.g., non-volatile memory, fuse, etc.). In one embodiment, the initial calibration is performed using a finite state machine (not shown). In one embodiment, during normal operation, $\Delta T$ is calculated periodically at required response rate in the form of a digital code $D(\Delta T)$. In one embodiment, a synthesized hardware or firmware performs a calculation: $D(I_{load})=K/D(\Delta T)$. In this embodiment, a digital code representation for the dynamic load current is generated which can be used to enhance VR performance.

Figure 5:
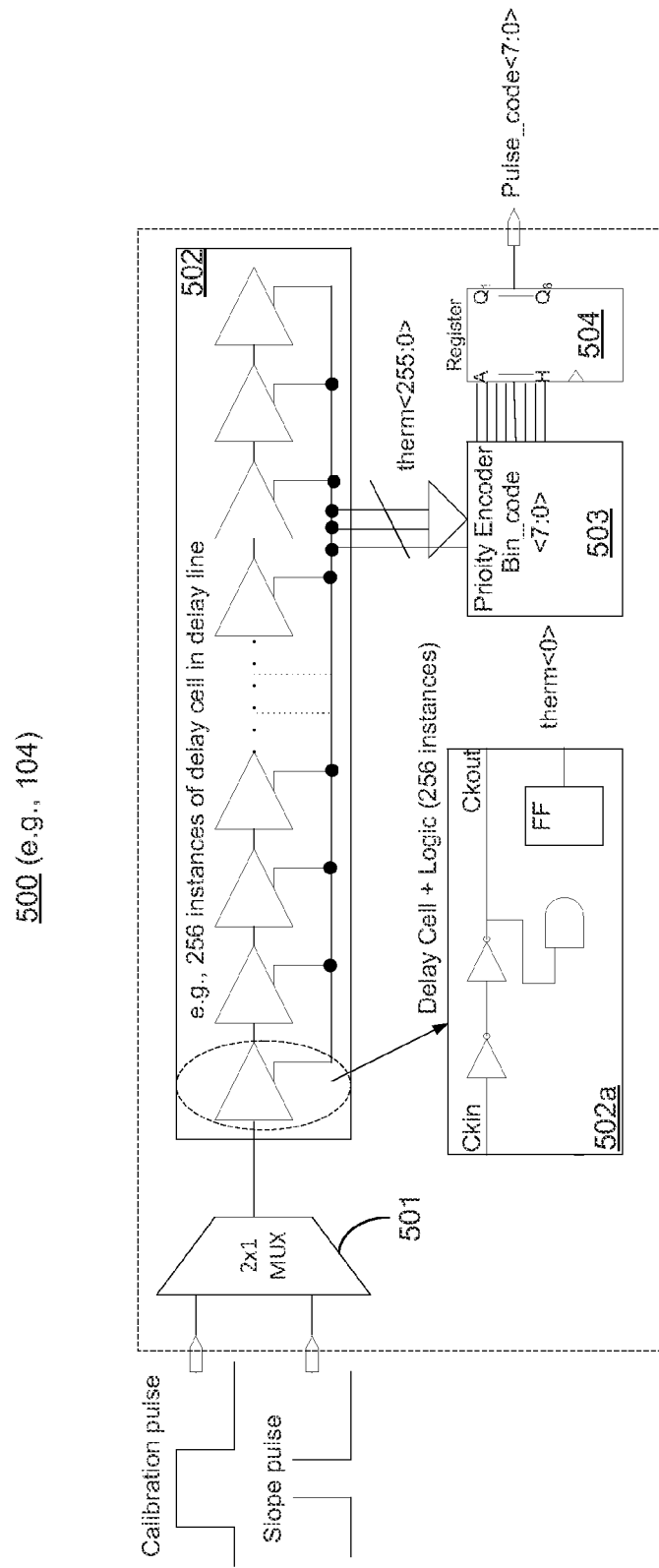
FIG. 5 illustrates a circuit for digitally converting the slope pulse into a digital code, according to one embodiment of the disclosure.

FIG. 5 illustrates a circuit 500 for digitally converting the slope pulse into a digital code, according to one embodiment of the disclosure. It is pointed out that those elements of FIG. 5 having the same reference numbers (or names) as the elements of any other figure can operate or function in any manner similar to that described, but are not limited to such.

In one embodiment, circuit 500 comprises multiplexer (MUX) 501, Delay Line 502, Priority Encoder 503, and Registers 504. In one embodiment, MUX 501 is used to select one of Calibration pulse or Slope pulse according to a logic level of a select signal (not shown). In one embodiment, during delay line calibration mode, an FSM (finite state machine) or any other logic provides a select signal to MUX 501 to cause it to select the Calibration pulse with known pulse width. In such an embodiment, a digital code (i.e., Pulse_code<7:0>) is generated representing the width of the Calibration pulse.

In one embodiment, output of MUX 501 is received by Delay Line 502, and output of each delay cell (e.g., 502a) of the Delay Line 502 is provided as a thermometer code (therm) to Priority Encoder 503. In one embodiment, MUX 501 is a 2:1 (i.e., two-to-one) multiplexer. In one embodiment, each delay cell includes logic to compare delayed pulse with the Calibration pulse. One such delay cell is shown as delay cell 502a. In one embodiment, delay cell 502 includes a pair of inverters (or a buffer) to buffer an input clock signal (Ckin), an AND gate that receives output of the buffer and output of MUX 501, and a flip-flop (FF) or an edge triggered sequential unit. Output of the buffer is output clock signal (Ckout) which is then used as input to the next delay cell. In other embodiments, other implementations of delay cell 502a can be used to achieve the same function.

In one embodiment, circuit 500 is used to compare the pulse width of Slope pulse signal from Bridge 102 with the fixed pulse width of a Calibration pulse (or reference pulse) generated from a known fixed clock source (e.g., a 10 ns wide pulse). In one embodiment, an existing clock source e.g., clock signal used in Controller 101 for compensation of VR, can be used for generating the Calibration pulse. However, the embodiments can be used with any available clock source to generate the Calibration pulse.

In one embodiment, an FSM (not shown) first selects a Calibration pulse (via MUX 501) to pass through the Delay line 502. In one embodiment, each delay cell has logic to compare the delayed pulse with the Calibration pulse. In one embodiment, if there is an overlap between the two pulses, the overlap pulse sets the output of FF in delay cell high. Once the delayed pulse is delayed more than the pulse width, the subsequent FF outputs of other delay cells remain low. In such an embodiment, a thermometer output is generated as an output of Delay line 502.

In this example, a 256 bit thermometer code (i.e., therm<255:0>, where therm<0> is the output of the first delay cell 502a) is generated by 256 delay cells of Delay line 502. In one embodiment, Priority Encoder 503 is used to convert the thermometer code (i.e., output of Delay line 502) to a binary code (e.g., an 8-bit code). In one embodiment, the binary code is then stored in Registers 504. The output Pulse code (e.g., 8 bit Pulse code, Pulse_code,7:0>) of Registers 504 represents the pulse width of the Calibration pulse (also referred here as D(Calibration_pulse)). In one embodiment, the thermometer code is directly converted into the output Pulse code.

In one embodiment, after D(Calibration_pulse) is stored in Registers 504, the FFs of the delay cells are reset and Delay Line 502 waits for the Slope pulse to pass through it. In one embodiment, during H-to-L transition of switching node Vx, Slope pulse is generated using Pulse Generator 203 and sent to circuit 500. In one embodiment, a binary code representing the pulse width of Slope pulse is generated in the same way as D(Calibration_pulse) is generated and stored in Registers as D(Slope_pulse).

Using the 8 bit digital code example, in one embodiment, the digital code $D(\Delta T)$ for the pulse width of Slope pulse can be calculated as:

$$D(\Delta T)=255*D(\text{bridge pulse})/D(\text{reference pulse})$$

and $D(I_{load})$ can be calculated as:

$$D(I_{load})=K/D(\Delta T)$$

The resolution of each delay cell can be designed (e.g., 100 ps at nominal process skew) to meet the required range and accuracy for current sensing circuit. The accuracy can be improved for higher resolution or relaxed for lower resolution. In one embodiment, circuit 500 is synthesizable digital circuit to convert Slope pulse width into a digital Pulse code (e.g., Pulse code<7:0>) which provides information about the load current of the VR dynamically.

Figure 6:
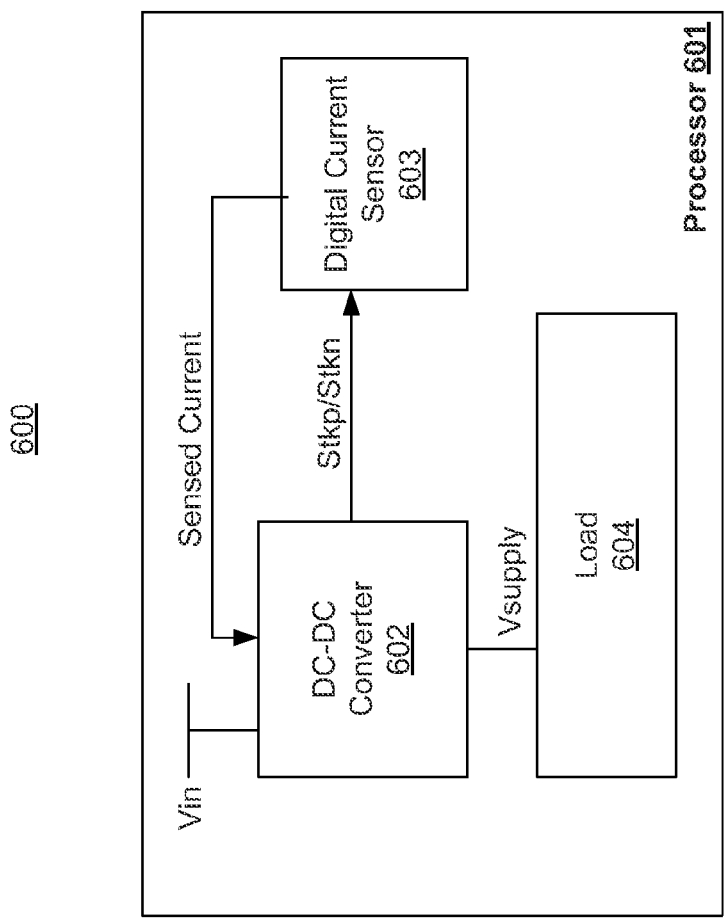
FIG. 6 illustrates a processor with a high-level apparatus of a DC-DC converter and digital current sensor, according to one embodiment of the disclosure.

FIG. 6 illustrates an apparatus 600 having processor 601 with a high-level apparatus of a DC-DC converter and Digital Current Sensor, according to one embodiment of the disclosure. It is pointed out that those elements of FIG. 6 having the same reference numbers (or names) as the elements of any other figure can operate or function in any manner similar to that described, but are not limited to such.

Apparatus 600 illustrates a usage model of the digital current sensor. Here, Apparatus 600 comprises a Processor 601 having a DC-DC Converter 602, a Digital Current Sensor 603 (according to the embodiments described here), and Load 604. Load 604 can be any load. For example. Load 604 can be a processor core, a memory, and logic unit, etc. Processor 601 can be a general processor, an application specific integrated circuit (ASIC), a field programmable array (FPGA) processor, a communication processor, a digital signal processor (DSP), a system-on-chip, a stacked processor, etc.

In one embodiment, DC-DC Converter 602 is a multi-phase switching VR where Digital Current Sensor 603 is used for current balancing. In case of multi-phase VR, the $D(\Delta T)$ code from each phase (or Bridge) is compared against each other phase and the duty-cycle of the PWM signal can be adjusted digitally until the codes match closely or completely.

In one embodiment, a single instance of pulse width to digital code converter 500 (part of Digital Current Sensor 603) is time multiplexed for different phases. In such an embodiment, D(Slope_pulse) codes for each phase is compared with D(Calibration_pulse) because D(Calibration_pulse) would essentially be the same for a common delay line. In one embodiment, phase-balancing can be done one-time or repeated periodically once the phases are balanced. In the embodiment where the multiple phases (or bridges) are on the same die using the same instance of Digital Current Sensor 603 at almost the same time instance, it makes the Digital Current Sensor 603 immune to skew variations from part to part (or die to die) or any temperature variations over time.

In one embodiment, Digital Current Sensor 603 is used for PWM-to-PFM switchover to optimize the efficiency of the DC-DC Converter 602 across the load current range. In one embodiment, Digital Current Sensor 603 causes the DC-DC Converter 602 to switch to a PFM/Hysteretic mode at light loads. In one embodiment, a pre-determined current code is set for the mode switch-over. In one embodiment, during power-up calibration, efficiency measurements on board are performed across the load current range to determine a $D(\Delta T)$ code corresponding to the load current optimal for switch-over from PWM mode to PFM mode. The optimal mode switch-over point is usually where efficiency of DC-DC Converter 602 is seen to drop when load current is swept from high to low. In one embodiment, since the set $D(\Delta T)$ code is dependent on the ratio of D(Slope_pulse) to D(Calibration_pulse), any variations in temperature or voltage will affect both the codes to the same degree and the ratio will remain almost constant. In one embodiment, during normal operation, if the measured $D(\Delta T)$ crosses the pre-set code for switch-over for few continuous cycles, then efficiency can be improved by entering PFM mode.

In one embodiment, Digital Current Sensor 603 is used for over-current protection. In one embodiment, like the PWM mode to PFM mode switch-over scheme discussed above, $D(\Delta T)$ is pre-set to a value for determining the over-current condition. Once the dynamically measured $D(\Delta T)$ code (as measured by Digital Current Sensor 603) falls below the pre-set code for few continuous cycles then DC-DC Converter 602 can be shut OFF.

Figure 7:
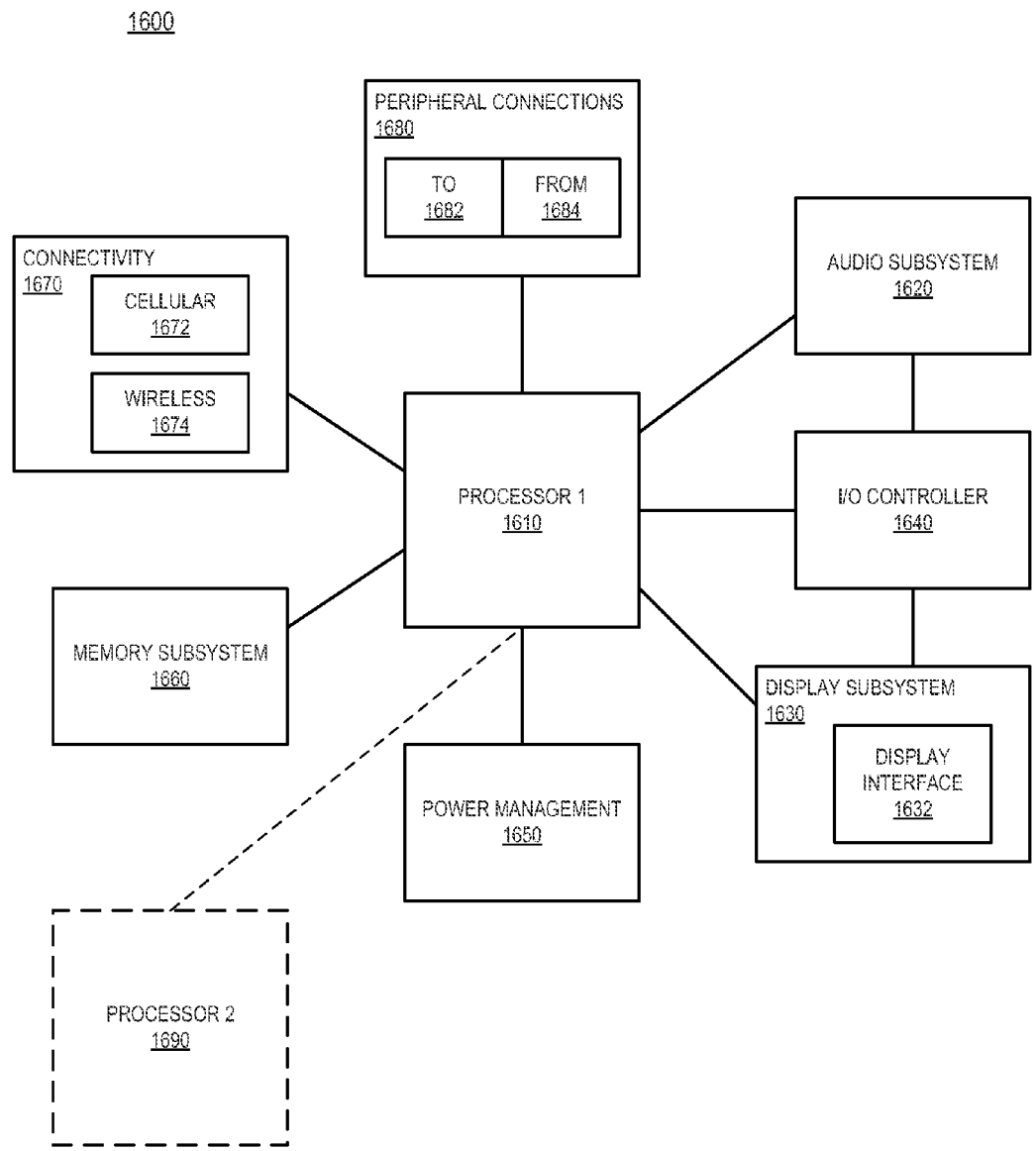
FIG. 7 is a smart device or a computer system or a SoC (System-on-Chip) having digital current sensor for a switching voltage regulator, according to one embodiment.

FIG. 7 is a smart device or a computer system or a SoC (System-on-Chip) having digital current sensor for a switching voltage regulator, according to one embodiment. It is pointed out that those elements of FIG. 7 having the same reference numbers (or names) as the elements of any other figure can operate or function in any manner similar to that described, but are not limited to such.

FIG. 7 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 having the digital current sensor according to embodiments described. Other blocks of the computing device 1600 having the digital current sensor according to embodiments described. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630.

Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: an output node; a high-side bridge to receive an input supply, the high-side bridge coupled to the output node; a low-side bridge coupled to ground and the output node; and a current sensor having inputs coupled to the high-side bridge and the low-side bridge. In one embodiment, the high-side bridge comprises two p-type devices coupled in series and a first common node, and wherein one of the inputs of the current sensor is coupled to the first common node.

In one embodiment, the low-side bridge comprises two n-type devices coupled in series and a second common node, and wherein one of the inputs of the current sensor is coupled to the second common node. In one embodiment, wherein the current sensor comprises: a first level shifter to level shift signal on the first common node, and to generate a first output. In one embodiment, the current sensor comprises: a second level shifter to level shift signal on the second common node, and to generate a second output. In one embodiment, the first and second level shifters have substantially identical propagation delays.

In one embodiment, the current sensor further comprises a latch to receive the first and second outputs, and to generate a pulse signal. In one embodiment, the apparatus further comprises a pulse width to digital code converter to convert the pulse signal into a digital code. In one embodiment, further comprises logic to convert the digital code to sensed current. In one embodiment, the current sensor is operable to measure slope of a signal on the output node. In one embodiment, the apparatus further comprises logic to convert the measured slope to a digital representation of current flowing through the output node.

In another example, a system is provided which comprises: a memory; a processor coupled to the memory, the processor having an apparatus according to the exemplary apparatus described above; and a wireless interface for coupling the processor to another device. In one embodiment, the system further comprises a display unit to display content processed by the processor.

In another example, an apparatus is provided which comprises: an output node; a capacitor; an inductor having a first terminal coupled to the output node, and a second terminal coupled to the capacitor; a bridge to receive an input power supply and to generate a switching voltage signal at the output node; and a current senor to determine slope of the switching voltage signal on the output node.

In one embodiment, the apparatus further comprises logic to convert the measured slope to a digital representation of current flowing through the output node. In one embodiment, the bridge comprises: a high-side switch coupled to the output node; and a low-side switch coupled in series with the high-side switch and the output node. In one embodiment, the high-side switch comprises: two p-type devices coupled in series; and a first common node, and wherein an input of the current sensor is coupled to the first common node. In one embodiment, the low-side bridge comprises: two n-type devices coupled in series; and a second common node, wherein another input of the current sensor is coupled to the second common node.

In another example, a system is provided which comprises: a memory; a processor coupled to the memory, the processor having an apparatus according to the exemplary apparatus described above; and a wireless interface for coupling the processor to another device. In one embodiment, the system further comprises a display unit to display content processed by the processor.

In another example, a method is provided which comprises: receiving by a high-side bridge an input supply, the high-side bridge coupled to an output node; and sensing load by a current sensor having inputs coupled to the high-side bridge and a low-side bridge. In one embodiment, the high-side bridge comprises two p-type devices coupled in series and a first common node, and wherein one of the inputs of the current sensor is coupled to the first common node. In one embodiment, the low-side bridge comprises two n-type devices coupled in series and a second common node, and wherein one of the inputs of the current sensor is coupled to the second common node.

In one embodiment, the method further comprises level shifting, by a first level shifter of the current sensor, a signal on the first common node to generate a first output. In one embodiment, the method further comprises level shifting, by a second level shifter of the current sensor, a signal on the second common node to generate a second output. In one embodiment, the first and second level shifters have substantially identical propagation delays. In one embodiment, the method further comprises receiving the first and second outputs by a compare logic or a larch, and to generate a pulse signal. In one embodiment, the method further comprises converting the pulse signal into a digital code.

In one embodiment, the method further comprises converting the digital code to sensed current. In one embodiment, the method further comprises measuring by the current sensor a slope of a signal on the output node. In one embodiment, the method further comprises converting the measured slope to a digital representation of current flowing through the output node.

In another example, an apparatus is provided which comprises: means for receiving by a high-side bridge an input supply, the high-side bridge coupled to an output node; and means for sensing load by a current sensor having inputs coupled to the high-side bridge and a low-side bridge. In one embodiment, the high-side bridge comprises two p-type devices coupled in series and a first common node, and wherein one of the inputs of the current sensor is coupled to the first common node. In one embodiment, the low-side bridge comprises two n-type devices coupled in series and a second common node, and wherein one of the inputs of the current sensor is coupled to the second common node.

In one embodiment, the apparatus further comprises means for level shifting a signal on the first common node to generate a first output. In one embodiment, the apparatus further comprises means for level shifting a signal on the second common node to generate a second output. In one embodiment, the apparatus further comprising means for receiving the first and second outputs by a compare logic or a larch, and to generate a pulse signal. In one embodiment, the apparatus further comprises means for converting the pulse signal into a digital code. In one embodiment, the apparatus further comprises means for converting the digital code to sensed current. In one embodiment, the apparatus further comprises means for measuring by the current sensor a slope of a signal on the output node. In one embodiment, the apparatus further comprises means for converting the measured slope to a digital representation of current flowing through the output node.

In another example, a system is provided which comprises: a memory; a processor coupled to the memory, the processor having an apparatus according to the exemplary apparatus described above; and a wireless interface for coupling the processor to another device. In one embodiment, the system further comprises a display unit to display content processed by the processor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an output node;
a high-side bridge to receive an input supply, the high-side bridge coupled to the output node;
a low-side bridge coupled to ground and the output node; and
a digital current sensor having inputs coupled to the high-side bridge and the low-side bridge, the digital current sensor to measure a slope of a signal on the output node and generate a digital code indicating sensed current.

2. The apparatus of claim 1, wherein the high-side bridge comprises two p-type devices coupled in series and a first common node, and wherein one of the inputs of the digital current sensor is coupled to the first common node.

3. The apparatus of claim 2, wherein the low-side bridge comprises two n-type devices coupled in series and a second common node, and wherein one of the inputs of the digital current sensor is coupled to the second common node.

4. The apparatus of claim 3, wherein the digital current sensor comprises:
a first level shifter to level shift signal on the first common node, and to generate a first output.

5. The apparatus of claim 4, wherein the digital current sensor comprises:
a second level shifter to level shift signal on the second common node, and to generate a second output.

6. The apparatus of claim 5, wherein the first and second level shifters have substantially identical propagation delays.

7. The apparatus of claim 5, wherein the digital current sensor further comprises a latch to receive the first and second outputs, and to generate a pulse signal.

8. The apparatus of claim 7 further comprises a pulse width to digital code converter to convert the pulse signal into the digital code indicating sensed current.

9. The apparatus of claim 8 further comprises logic to convert the digital code to a sensed current value.

10. The apparatus of claim 1 further comprises logic to convert the measured slope to a digital representation of current flowing through the output node.

11. An apparatus comprising:
an output node;
a capacitor;
an inductor having a first terminal coupled to the output node, and a second terminal coupled to the capacitor;
a bridge to receive an input power supply and to generate a switching voltage signal at the output node; and
a current sensor to determine slope of the switching voltage signal on the output node.

12. The apparatus of claim 11 further comprises logic to convert the measured slope to a digital representation of current flowing through the output node.

13. The apparatus of claim 11, wherein the bridge comprises:
a high-side switch coupled to the output node; and
a low-side switch coupled in series with the high-side switch and the output node.

14. The apparatus of claim 13, wherein the high-side switch comprises:
two p-type devices coupled in series; and
a first common node, and wherein an input of the current sensor is coupled to the first common node.

15. The apparatus of claim 14, wherein the low-side bridge comprises:
two n-type devices coupled in series; and
a second common node, wherein another input of the current sensor is coupled to the second common node.

16. A system comprising:
a memory;
a processor coupled to the memory, the processor having a voltage regulator comprising:
an output node;
a high-side bridge to receive an input supply, the high-side bridge coupled to the output node;
a low-side bridge coupled to ground and the output node; and
a current sensor having inputs coupled to the high-side bridge and the low-side bridge; and
a wireless interface for coupling the processor to another device.

17. The system of claim 16 further comprises a display unit to display content processed by the processor.

18. The system of claim 16, wherein the current sensor is operable to measure slope of a signal on the output node.

19. The system of claim 18 further comprises logic to convert the measured slope to a digital representation of current flowing through the output node.

* * * * *